US012656904B2

(12) United States Patent
Lee et al.

(10) Patent No.: US 12,656,904 B2
(45) Date of Patent: Jun. 16, 2026

(54) TOUCH SENSING MODULE AND DISPLAY DEVICE INCLUDING THE SAME

(71) Applicant: Samsung Display Co., Ltd., Yongin-Si (KR)

(72) Inventors: Seung Chan Lee, Yongin-si (KR); Sang Hyun Jun, Yongin-si (KR); Sae Young Hong, Yongin-si (KR); Kwang Min Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/004,458

(22) Filed: Dec. 30, 2024

(65) Prior Publication Data

US 2025/0335053 A1 Oct. 30, 2025

(30) Foreign Application Priority Data

Apr. 25, 2024 (KR) ........................ 10-2024-0055079

(51) Int. Cl.
*G06F 3/041* (2006.01)
*H10K 59/40* (2023.01)

(52) U.S. Cl.
CPC ...... *G06F 3/04166* (2019.05); *G06F 3/04164* (2019.05); *G06F 3/0418* (2013.01); *H10K 59/40* (2023.02)

(58) Field of Classification Search
None
See application file for complete search history.

(56) References Cited

U.S. PATENT DOCUMENTS

| | | | |
|---|---|---|---|
| 10,732,775 B2 | 8/2020 | Kim et al. | |
| 10,775,916 B2 | 9/2020 | Kim et al. | |
| 2018/0033806 A1* | 2/2018 | Long | H10D 86/60 |
| 2018/0307368 A1* | 10/2018 | Koide | H10D 86/421 |
| 2022/0189377 A1* | 6/2022 | Wang | G09G 3/3266 |
| 2022/0328598 A1* | 10/2022 | Zhao | H10K 59/131 |
| 2024/0045545 A1* | 2/2024 | Xu | G06F 3/041 |

FOREIGN PATENT DOCUMENTS

KR 10-2508964 B1 3/2023

* cited by examiner

*Primary Examiner* — Krishna P Neupane
(74) *Attorney, Agent, or Firm* — Innovation Counsel LLP

(57) ABSTRACT

The present disclosure relates to a touch sensing module and a display device including the same. According to an aspect of the present disclosure, a touch sensing module has a touch sensing unit including touch electrodes that are arranged in a touch sensing area and touch lines connected one-to-one to the touch electrodes, and a touch driver detecting touch position coordinates by analyzing touch sensing signals detected from the touch electrodes, wherein the touch sensing unit comprises first through n-th signal selection circuit units supplying touch driving signals to the touch electrodes through the touch lines, respectively, and receiving touch sensing signals from the touch electrodes, and first through n-th antistatic circuit units applying a constant voltage of a preset level to input/output terminals of the first through n-th signal selection circuit units.

20 Claims, 8 Drawing Sheets

TOUCH SENSING MODULE AND DISPLAY DEVICE INCLUDING THE SAME

This application claims the benefit of Korean Patent Application No. 10-2024-0055079 filed on Apr. 25, 2024 in the Korean Intellectual Property Office, the disclosure of which is incorporated herein in its entirety by reference.

BACKGROUND

1. Field

The present disclosure relates to a touch sensing module and a display device including the same.

2. Description of the Related Art

With the development of information society, demand for display devices has been increasing rapidly. Display devices are incorporated in various electronic devices such as smart-phones, digital cameras, notebook computers, navigation devices, and smart televisions.

Display devices may be in the form of flat panel display devices such as liquid crystal display devices, field emission display devices, and organic light emitting display devices. Among these flat panel display devices, a light emitting display device includes a light emitting element that enables each pixel of a display panel to emit light by itself. Thus, the light emitting display device can display an image without a backlight unit that provides light to the display panel.

Recently, a display device has come to include a touch sensing module for detecting a user's touch as one of input sources. The touch sensing module includes a touch sensing unit in which touch electrodes are arranged and a touch driver which detects the amount of charge in capacitance between the touch electrodes. The touch sensing module may be formed integrally with an image display unit of the display device or may be mass-produced in a state in which it is mounted on the front of the image display unit.

SUMMARY

Aspects of the present disclosure provide a touch sensing module capable of safely protecting signal selection circuits, which individually supplies touch driving signals to touch electrodes of a touch sensing unit and detect touch sensing signals, and a display device including the touch sensing module.

Aspects of the present disclosure also provide a touch sensing module in which an antistatic circuit is selectively formed in pad units of signal input/output terminals of signal selection circuits to minimize damage applied to the signal selection circuits and a display device including the touch sensing module.

However, aspects of the present disclosure are not restricted to the one set forth herein. The above and other aspects of the present disclosure will become apparent to one of ordinary skill in the art to which the present disclosure pertains by referencing the detailed description of the present disclosure given below.

According to an aspect of the present disclosure, a touch sensing module comprises a touch sensing unit including touch electrodes that are arranged in a touch sensing area and touch lines connected one-to-one to the touch electrodes, and a touch driver detecting touch position coordinates by analyzing touch sensing signals detected from the touch electrodes, wherein the touch sensing unit comprises first through n-th signal selection circuit units supplying touch driving signals to the touch electrodes through the touch lines, respectively, and receiving touch sensing signals from the touch electrodes, and first through n-th antistatic circuit units applying a constant voltage of a preset size to input/output terminals of the first through n-th signal selection circuit units.

According to another aspect of the present disclosure, display device comprising a display panel comprising a display area where a plurality of pixels are arranged, and a touch sensing module extending to the front of the display panel and detecting a touch of a user, wherein the touch sensing module comprises a touch sensing unit including touch electrodes that are arranged in a touch sensing area and touch lines connected one-to-one to the touch electrodes, and a touch driver detecting touch position coordinates by analyzing touch sensing signals detected from the touch electrodes, wherein the touch sensing unit comprises first through n-th signal selection circuit units supplying touch driving signals to the touch electrodes through the touch lines, respectively, and receiving touch sensing signals from the touch electrodes, and first through n-th antistatic circuit units applying a constant voltage of a preset level to input/output terminals of the first through n-th signal selection circuit units. A touch sensing module and a display device including the same according to an embodiment of the present disclosure can safely protect signal selection circuits formed in a touch sensing unit from overvoltage and overcurrent caused by static electricity, etc.

In addition, since an antistatic circuit of an electrostatic circuit type is selectively formed in pad units of signal input/output terminals layer of the signal selection circuits, it is possible to minimize electrical damage applied to the signal selection circuits while stabilizing the size of input/output signals to the size of a constant voltage.

However, the effects of the present disclosure are not restricted to the one set forth herein. The above and other effects of the present disclosure will become more apparent to one of daily skill in the art to which the present disclosure pertains by referencing the claims.

BRIEF DESCRIPTION OF THE DRAWINGS

These and/or other aspects will become apparent and more readily appreciated from the following description of the embodiments, taken in conjunction with the accompanying drawings in which:

FIG. 8 is a circuit diagram of second and third antistatic circuits illustrated in FIG. 7.

DETAILED DESCRIPTION

The present disclosure will now be described more fully hereinafter with reference to the accompanying drawings, in which preferred embodiments of the disclosure are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will be understood that when a layer is referred to as being "on" another layer or substrate, it can be directly on the other layer or substrate, or intervening layers may be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the present disclosure. Similarly, the second element could also be termed the first element.

Each of the features of the various embodiments of the present disclosure may be combined or combined with each other, in part or in whole, and technically various interlocking and driving are possible. Each embodiment may be implemented independently of each other or may be implemented together in an association.

Hereinafter, specific embodiments will be described with reference to the accompanying drawings.

Figure 1:
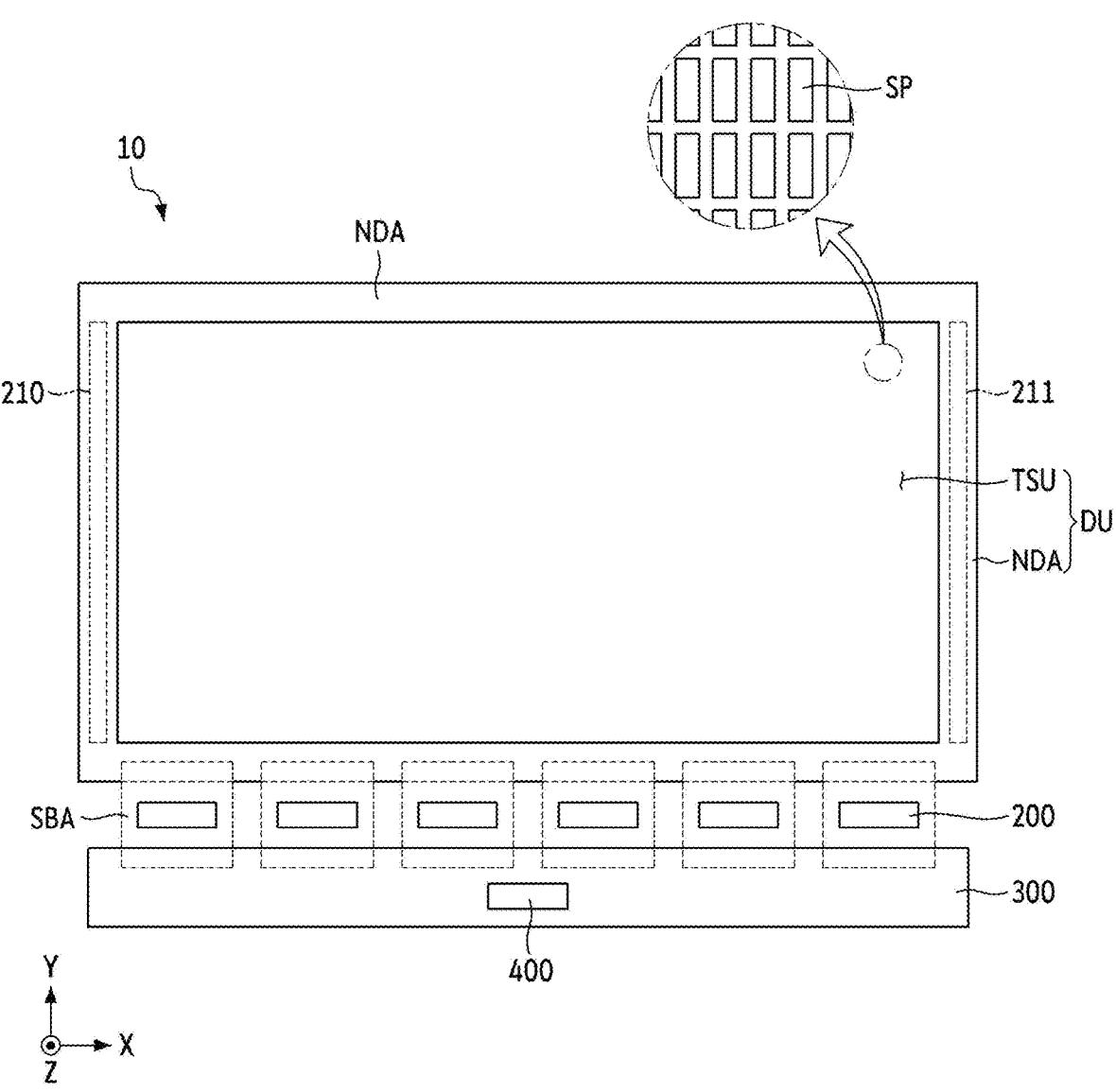
FIG. 1 is a plan view of a display device according to an embodiment of the present disclosure.
Figure 2:
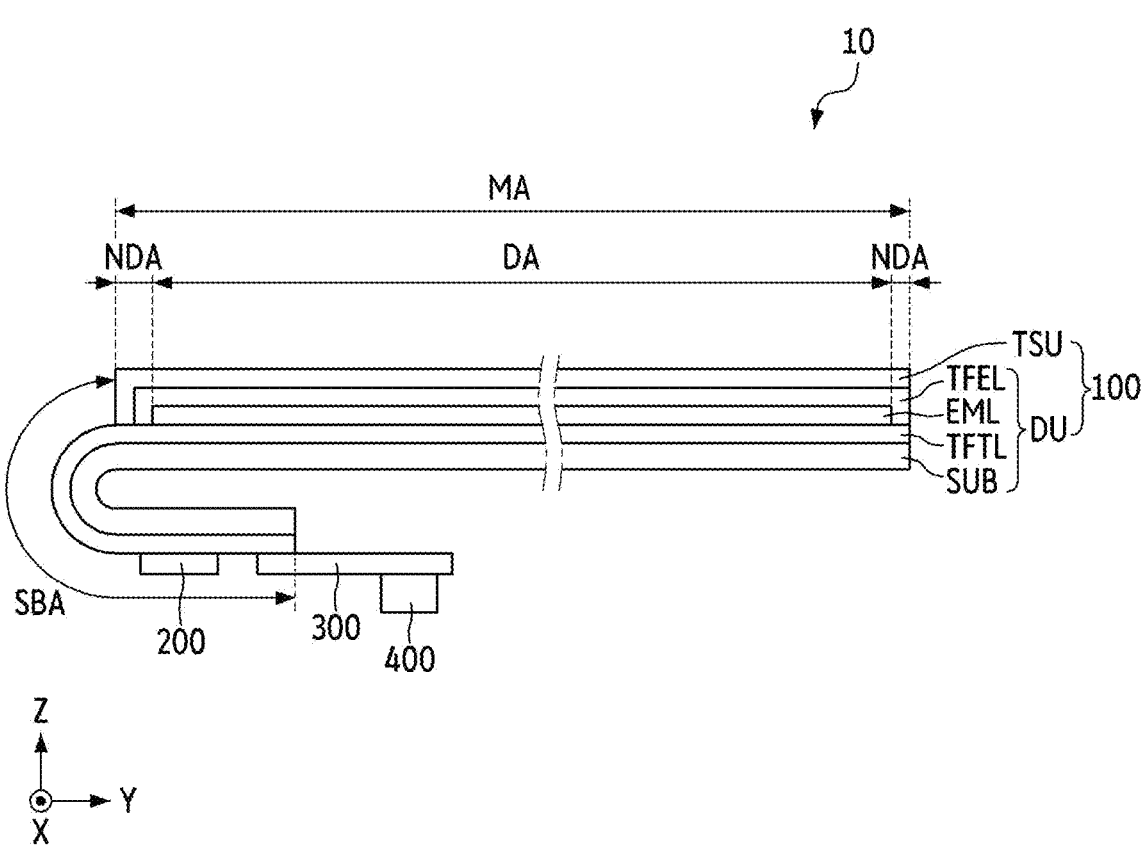
FIG. 2 is a detailed lateral cross-sectional view of the display device of FIG. 1.

FIG. 1 is a plan view of a display device 10 according to an embodiment of the present disclosure. FIG. 2 is a detailed lateral cross-sectional view of the display device 10 of FIG. 1.

Referring to FIGS. 1 and 2, the display device 10 according to the embodiment may be applied to portable electronic devices such as tablet personal computers (PCs), portable multimedia players (PMPs), navigation devices, ultra-mobile PCs (UMPCs), electronic books, electronic notebooks, mobile phones, smartphones, and mobile communication terminals. For example, the display device 10 may be applied as a display unit of a television, a notebook computer, a monitor, a billboard, or an Internet of things (IoT) device.

The display device 10 according to the embodiment may be variously classified according to a display method. For example, the display device 10 may be classified and configured as a micro-light emitting diode display device, a nano-light emitting diode display device, a liquid crystal display (LCD) device, a plasma display panel (PDP), a field emission display (FED) device, an electrophoretic display (EPD) device, an organic light emitting diode display device, an inorganic electroluminescent (EL) display device, or a quantum dot light emitting display device (QED). An organic light emitting diode display device will be described below as an example of the display device 10 according to the embodiment. Unless a special distinction is required, the organic light emitting diode display device applied to embodiments will be shortened to the display device 10. However, the display device 10 according to the embodiment is not limited to the organic light emitting diode display device, and other display devices listed above or known in the art can also be applied within the scope sharing the technical spirit.

The display device 10 according to the embodiment may have a rectangular shape, a square shape, a circular shape, an oval shape, or a quadrangular shape in plan view. In addition, when the display device 10 is a mobile device such as a tablet PC, it may have a rectangular shape with its long sides located in a horizontal direction. However, the present disclosure is not limited thereto, and the long sides may also be located in a vertical direction, or the display device 10 may be rotatably installed so that the long sides can be variably located in the horizontal or vertical direction.

Referring to FIG. 2, the display device 10 includes a display panel 100, a main driving circuit 200, a touch sensing unit TSU, a circuit board 300, and a touch driving circuit 400. The display panel 100 includes a display unit DU including a substrate SUB, a thin film transistor layer TFTL, a light emitting layer EML and an encapsulation layer TFEL and the touch sensing unit TSU disposed on the display unit DU. Although not explicitly shown in FIG. 2, the display device 100 may include a first scan driver 210 and a second driver 211 in the non-display area NDA, as depicted in FIG. 1.

The display panel 100 of the display device 10 includes a display unit DU which displays an image, and the touch sensing unit TSU which detects a touch of a human body part such as a finger or an electronic pen is disposed on the display panel 100. The display unit DU of the display panel 100 may include a plurality of pixels SP and display an image through the pixels SP. In addition, the touch sensing unit TSU of the display panel 100 may be mounted on the front of the display panel 100 or may be formed integrally with the display panel 100. The touch sensing unit TSU may include a plurality of touch electrodes and may detect a user's touch in a capacitive manner using the touch electrodes.

The first scan driver 210 supplies a gate scan signal to the pixels SP for each horizontal line through a gate line for each horizontal line of the display unit DU based on a first gate control signal from the touch driving circuit 400. The first scan driver 210 sequentially drives the pixels SP on a horizontal line-by-horizontal line basis by sequentially supplying gate scan signals to the gate lines for the horizontal lines. In addition, the second scan driver 211 supplies compensation gate scan signals to compensation gate lines for the horizontal lines of the display unit DU based on a second gate control signal. The second scan driver 211 controls pixel driving voltages of the pixels SP to be output on a horizontal line-by-horizontal line basis by sequentially supplying the compensation gate scan signals to the compensation gate lines for the horizontal lines.

The data driver 200 may include a plurality of data driving integrated circuits. The data driver 200 outputs data voltages according to image data to the pixels SP of the display unit DU based on a data driving control signal from the touch driving circuit 400. Specifically, the data driving integrated circuits may supply the data voltages to data lines, to which the pixels SP are connected, on a horizontal line-by-horizontal line basis every horizontal period.

The touch driving circuit 400 may operate as a main processor or may be formed integrally with the main processor. Accordingly, the touch driving circuit 400 may control the overall function of the display device 10. For example, the touch driving circuit 400 sorts image data from the outside and supplies the sorted image data to the data driving integrated circuits of the data driver 200 and controls the driving timing of the data driver 200. In addition, the touch driving circuit 400 controls the gate scan signal output timing of the first scan driver 210 and the compensation gate scan signal output timing of the second scan driver 211. In addition, the touch driving circuit 400 generates data control signals to control the data voltage output timings of the data driving integrated circuits included in the data driver 200.

The touch driving circuit 400 may detect touch coordinate information included in touch data of the touch sensing unit TSU and then generate digital image data according to the touch coordinate information. In addition, the touch driving circuit 400 may execute an application indicated by an icon displayed at a user's touch coordinates. For example, the touch driving circuit 400 may receive coordinate data from an electronic pen, determine touch coordinates of the electronic pen, and then generate digital image data according to the touch coordinates or execute an application indicated by an icon displayed at the touch coordinates of the electronic pen.

Referring to FIG. 2, the display panel 100 may be divided into a main area MA and a sub-area SBA. The main area MA may include a display area DA having the pixels SP for displaying an image and a non-display area NDA disposed around the display area DA. In the display area DA, light may be emitted from an emission area or opening area of each pixel SP to display an image. To this end, each pixel SP of the display area DA may include a pixel circuit including switching elements, a pixel defining layer defining an emission area or an opening area, and a self-light emitting element.

The non-display area NDA may be any one peripheral area of the display area DA or an area outside the display area DA. The non-display area NDA may be defined as an edge area of the main area MA of the display panel 100. In the non-display area NDA, fan-out lines (not illustrated) connecting the first and second scan drivers 210 and 211, the data driver 200 and the touch driving circuit 400 to the display area DA may be formed.

The sub-area SBA may extend from a side of the main area MA. The sub-area SBA may be made of a flexible film that can be bent, folded, rolled, etc. For example, when the sub-area SBA is bent, it may be overlapped by the main area MA in a thickness direction (Z-axis direction). The sub-area SBA may include the data driver 200 and a pad unit connected to a circuit board 300. The pad unit, although not explicitly depicted in FIG. 2, is between the circuit board 300 and the TFTL. Optionally, the sub-area SBA may be omitted, and the data driver 200 and the pad unit may be disposed in the non-display area NDA.

The data driver 200 may be formed as a plurality of integrated circuits and mounted on the display panel 100 using a chip on glass (COG) method, a chip on plastic (COP) method, or an ultrasonic bonding method. For example, the data driver 200 may be disposed in the sub-area SBA and may be overlapped by the main area MA in the thickness direction (Z-axis direction) by the bending of the sub-area SBA. For another example, the data driver 200 may be mounted on the circuit board 300.

The circuit board 300 may be electrically connected to the pad unit of the display panel 100 by an anisotropic conductive film (ACF). To this end, lead lines of the circuit board 300 may be electrically connected to the pad unit of the display panel 100. The circuit board 300 may be a flexible printed circuit board, a printed circuit board, or a flexible film such as a chip on film.

The touch driving circuit 400 may be mounted on the circuit board 300. The touch driving circuit 400 may be formed as an integrated circuit.

Figure 3:
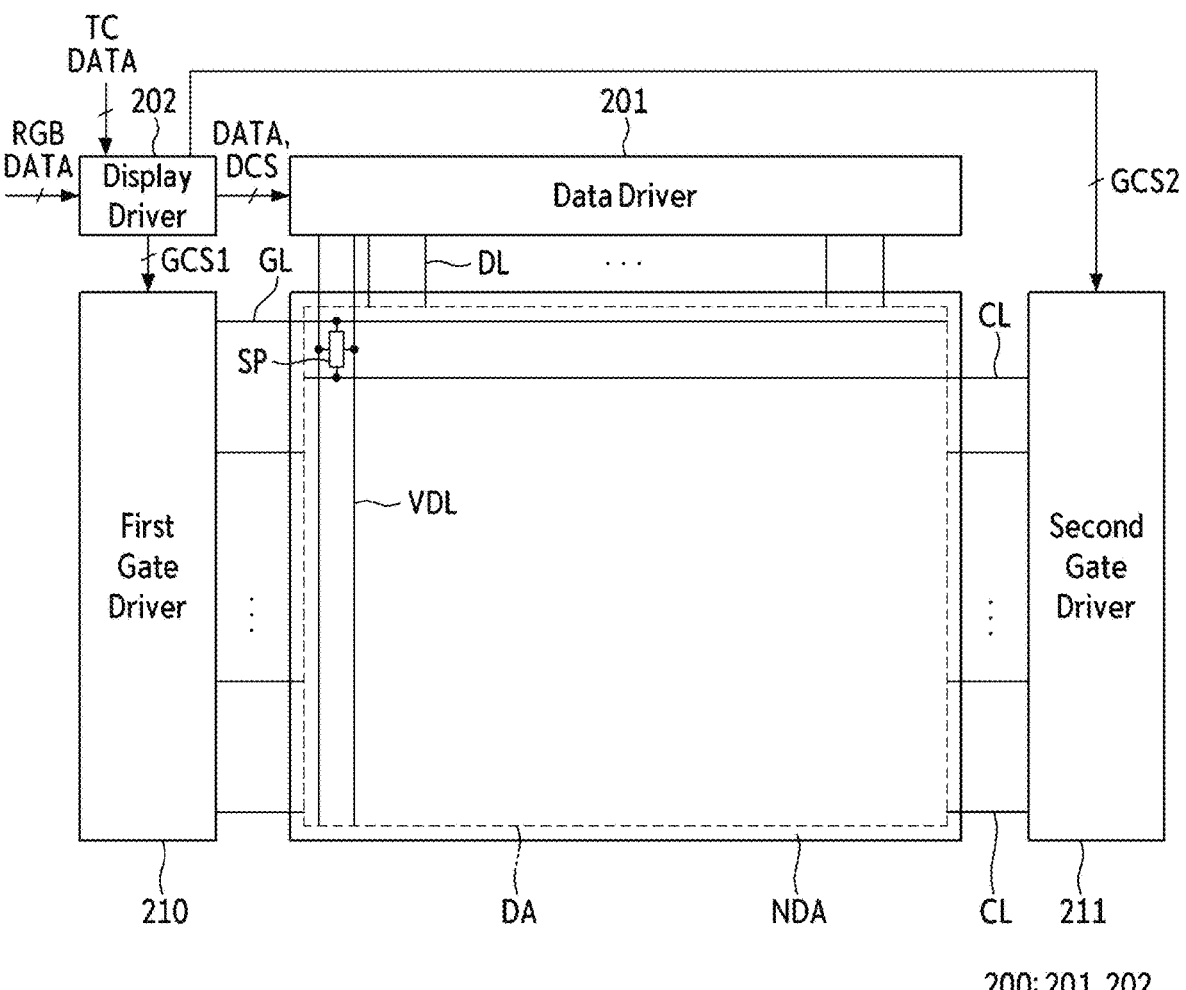
FIG. 3 is a block diagram illustrating an electrical connection relationship between a display panel and drivers illustrated in FIGS. 1 and 2.

FIG. 3 is a block diagram illustrating an electrical connection relationship between the display panel 100 and the drivers illustrated in FIGS. 1 and 2.

Referring to FIG. 3, a plurality of pixels SP are arranged in a matrix type in the display area DA. In addition, a plurality of gate lines GL, each connected to the pixels SP for a horizontal line layer, and a plurality of compensation gate lines CL, each connected to the pixels SP for a horizontal line layer, are arranged in the display area DA and the non-display area NDA.

The gate lines GL and the compensation gate lines CL may extend in an X-axis direction which is a first horizontal direction and may be spaced apart from each other in a first vertical direction intersecting the first horizontal direction. The gate lines GL and the compensation gate lines CL may be arranged at regular intervals along the first vertical direction.

The first scan driver 210 supplies a gate scan signal to the pixels SP for each horizontal line through a gate line GL for each horizontal line based on a first gate control signal GCS1 from the touch driving circuit 400. The gate lines GL sequentially supply gate scan signals, which are sequentially generated in each horizontal period from the first scan driver 210, to the pixels SP on a horizontal line-by-horizontal line basis.

The second scan driver 211 controls pixel driving voltages and currents of the pixels SP to be output to voltage detection lines on a horizontal line-by-horizontal line basis. To this end, the second scan driver 211 sequentially supplies compensation gate scan signals to the compensation gate lines CL for the horizontal lines based on a second gate control signal GCS2 from the touch driving circuit 400. The compensation gate lines CL sequentially supply the compensation gate scan signals, which are sequentially generated in each horizontal period from the second scan driver 211, to the pixels SP on a horizontal line-by-horizontal line basis.

The gate scan signals of the first scan driver 210 and the compensation gate scan signals of the second scan driver 211 may be generated alternately at different timings in different horizontal periods layer. For example, a gate scan signal may first be supplied to a gate line GL in each horizontal period, and a compensation gate scan signal may be supplied to a compensation gate line CL in each next horizontal period.

In addition, a plurality of data lines DL, each connected to the pixels SP for a vertical line layer, are arranged in the display area DA and the non-display area NDA. The data lines DL are electrically connected to the data driver 200. A data voltage may determine an emission luminance of each of the pixels SP. In addition, a plurality of voltage detection lines VDL, each connected to the pixels SP for a vertical line layer, are arranged in the display area DA and the non-display area NDA. The voltage detection lines VDL are electrically connected to the data driver 200. The pixels SP for a horizontal line share pixel driving voltages with the voltage detection lines VDL, respectively, in response to a compensation gate scan signal input in each horizontal period. Accordingly, the data driver 200 receives the pixel driving voltages and currents of the pixels SP on a horizontal line-by-horizontal line basis through the voltage detection lines VDL, respectively.

Specifically, the data driving integrated circuits of the data driver 200 receive and sense the pixel driving voltages and currents of the pixels SP for each horizontal line in each horizontal period through the voltage detection lines VDL, respectively. For example, the data driving integrated circuits may sequentially sense pixel driving voltages and currents received from the pixels SP for each horizontal line in each horizontal period.

The data driving integrated circuits generate voltage sensing data or current sensing data by performing analog-digital modulation on the sensed pixel driving voltages and currents of the pixels SP according to the levels of the pixel driving voltages and the amounts of the currents. The data driving integrated circuits transmit the voltage and current sensing data to the touch driving circuit 400 in units of at least one horizontal line.

The touch driving circuit 400 may receive digital image data RGB DATA and timing synchronization signals from the outside. The touch driving circuit 400 sorts the image data RGB DATA input from the outside in units of at least one frame according to the resolution of the display area DA. Then, the touch driving circuit 400 sequentially supplies the sorted image data to the data driving integrated circuits of the data driver 200 in units of at least one horizontal line. In addition, the touch driving circuit 400 controls the operation timing of the data driver 200 by generating a data driving control signal DCS based on the timing synchronization signals. In addition, the touch driving circuit 400 controls the operation timings of the first and second scan drivers 210 and 211 independently layer by generating the first and second gate driving control signals GCS1 and GCS2.

The data driving integrated circuits of the data driver 200 supply data voltages according to image data DATA to the data lines DL of the display unit DU based on the data driving control signal DCS. Here, the data driving integrated circuits may supply the data voltages to the data lines DL, to which the pixels SP are connected, on a horizontal line-by-horizontal line basis every horizontal period.

Figure 4:
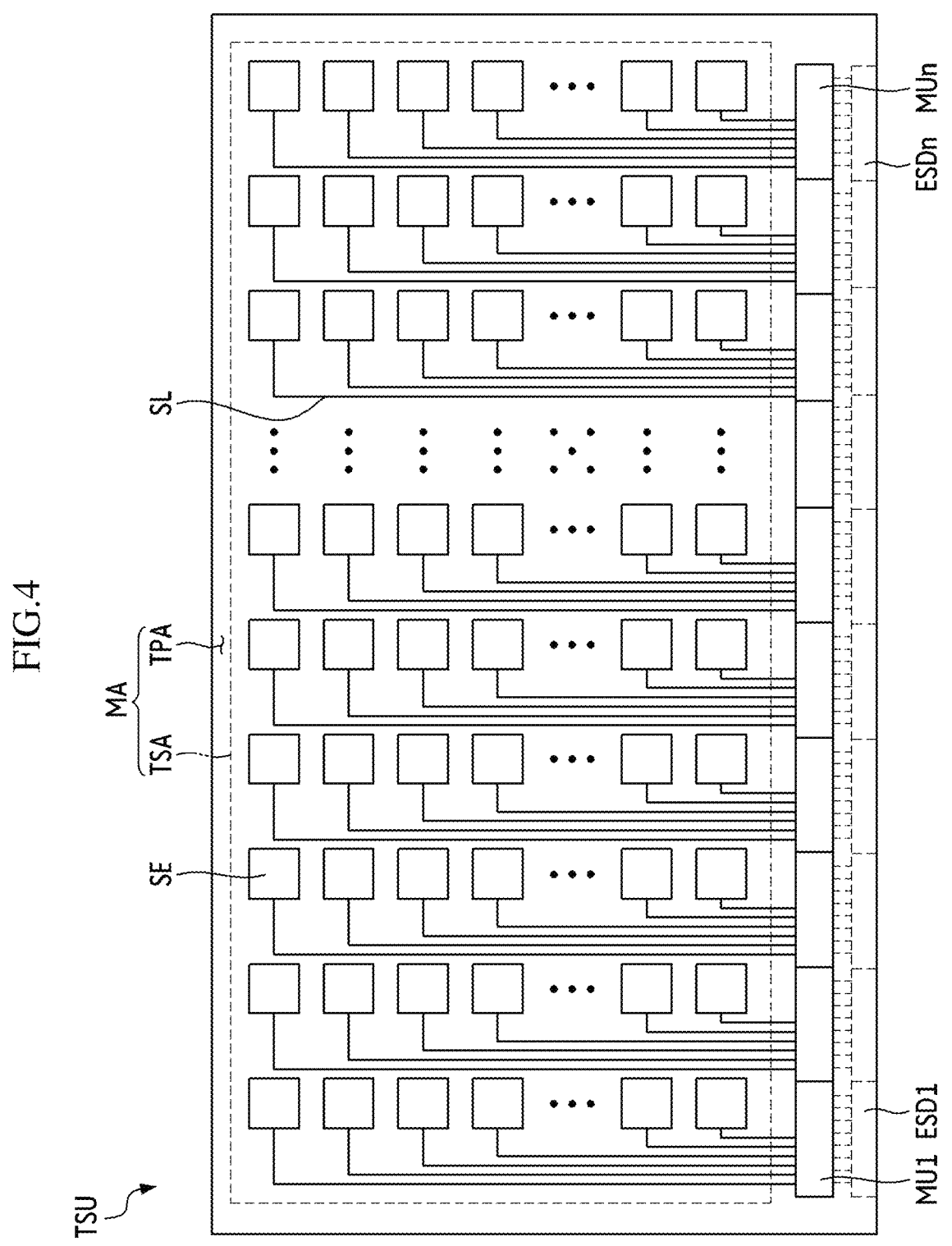
FIG. 4 is a schematic layout view of an embodiment of a touch sensing unit illustrated in FIGS. 1 and 2.

FIG. 4 is a schematic layout view of an embodiment of the touch sensing unit TSU illustrated in FIGS. 1 and 2.

Referring to FIG. 4, the touch sensing unit TSU includes touch electrodes SE, touch lines SL, first through $n^{th}$ signal selection circuit units MU1 through MUn, first through $n^{th}$ antistatic circuit units ESD1 through ESDn, and a touch driver which detects touch position coordinates by analyzing touch sensing signals. Since the touch driver is formed in the form of an integrated circuit, it is formed integrally with the touch driving circuit 400.

Specifically, a main area MA of the touch sensing unit TSU includes a touch sensing area TSA for detecting a user's touch and a touch peripheral area TPA disposed around the touch sensing area TSA. The touch sensing area TSA may overlap the display area DA of FIGS. 1 through 3, and the touch peripheral area TPA may overlap the non-display area NDA.

In the touch sensing area TSA, a plurality of touch electrodes SE may be formed and arranged in a matrix structure in plan view. The touch electrodes SE are connected one-to-one to the touch lines SL extending along the touch sensing area TSA and into the touch peripheral area TPA. The touch lines SL extend in the touch sensing area TSA from a respective one of the touch electrodes SE to the touch peripheral area TPA.

In FIG. 4, a structure in which each of the touch electrodes SE is formed in a rectangular planar shape is illustrated as an example. However, the present disclosure is not limited thereto. For example, the touch electrodes SE may also be formed in a planar shape other than a rectangle, such as a rhombus, a square, a polygon other than a quadrangle, a circle, or an oval.

The touch electrodes SE are connected to the touch lines SL extending in one side direction of the touch sensing area TSA to receive touch driving signals through the touch lines SL, respectively.

Each of the touch lines SL is connected to any one of the first through $n^{th}$ signal selection circuit units MU1 through MUn formed in the sub-area SBA of the display panel 100 via a part of the touch peripheral area TPA. For example, each of the touch lines SL may be connected to any one of the first through $n^{th}$ signal selection circuit units MU1 through MUn formed in the sub-area SBA via an area between the touch electrodes SE. In this case, the touch lines SL may be connected one-to-one to first and second touch pads disposed in a pad unit. Here, n is a natural number equal to or greater than 1, and the $n^{th}$ signal selection circuit unit MUn may vary according to the number of touch electrodes SE.

The first through $n^{th}$ signal selection circuit units MU1 through MUn supply touch driving signals to the touch electrodes SE through the touch lines SL, respectively, and receive touch sensing signals from the touch electrodes SE. For example, the first through $n^{th}$ signal selection circuit units MU1 through MUn supply touch driving signals to the touch electrodes SE through the touch lines SL, respectively, for a first preset period. In addition, they detect touch sensing signals received from the touch electrodes SE through the touch lines SL, respectively, for a second preset period. Here, the first period and the second period may be preset in units of at least one frame period.

Each of the first through $n^{th}$ signal selection circuit units MU1 through MUn includes first through $n^{th}$ signal selection circuits. For example, the first signal selection circuit unit MU1 includes first through $n^{th}$ signal selection circuits connected one-to-one to the touch electrodes SE through the touch lines SL, respectively. Likewise, the $n^{th}$ signal selection circuit unit MUn also includes first through $n^{th}$ signal selection circuits connected one-to-one to the touch electrodes SE through the touch lines SL, respectively. As described above, n is a natural number equal to or greater than 1, and the $n^{th}$ signal selection circuit may vary according to the number of touch electrodes SE.

The first through $n^{th}$ signal selection circuits included in each of the first through nth signal selection circuit units MU1 through MUn may receive touch driving signals of different voltage levels through a separate power supply unit. Then, each of the first through $n^{th}$ signal selection circuits MU1 through MUn may supply any one of the touch driving signals to a touch line SL and a touch electrode SE that is connected one-to-one to the touch line SL in response to a touch control signal input from the touch driving circuit 400 in the first period.

On the other hand, in response to a touch control signal input from the touch driving circuit 400 in the second period, each of the first through $n^{th}$ signal selection circuits electrically connects the touch line SL and the touch electrode SE, which are connected one-to-one, to a touch sensing signal output line. That is, each of the first through $n^{th}$ signal selection circuits may control a touch sensing voltage of the touch electrode SE to be transmitted to the touch line SL and the touch sensing signal output line in response to the touch control signal input from the touch driving circuit 400 in the second period.

The first through $n^{th}$ antistatic circuit units ESD1 through ESDn may be connected one-to-one to the first through $n^{th}$ signal selection circuit units MU1 through MUn and may apply a constant voltage of a preset level to signal input/output lines (or input/output terminals) of the first through $n^{th}$ signal selection circuit units MU1 through MUn.

Each of the first through $n^{th}$ antistatic circuit units ESD1 through ESDn includes at least one antistatic circuit which applies a constant voltage of a preset level to at least one of the signal input/output lines (or input/output terminals) of the first through $n^{th}$ signal selection circuit units MU1 through MUn.

For example, at least one antistatic circuit included in each of the first through nth antistatic circuit units ESD1 through ESDn may be connected to at least one of the signal input/output lines (or input/output terminals) of the first through $n^{th}$ signal selection circuits included in the first through $n^{th}$ signal selection circuit units MU1 through MUn.

At least one antistatic circuit applies a constant voltage of a preset level to at least one of the signal input/output lines (or input/output terminals) of the first through $n^{th}$ signal selection circuits. Accordingly, in a constant voltage state, at least one of the signal input/output lines (or input/output terminals) of the first through $n^{th}$ signal selection circuits may vary in their voltage levels in real time according to a change in the voltage levels of the input/output signals. Therefore, even if an overcurrent or overvoltage caused by static electricity, etc. is applied to the signal input/output lines (or input/output terminals) of the first through $n^{th}$ signal selection circuits, the signal input/output lines (or input/output terminals) of the first through $n^{th}$ signal selection circuits layer may quickly change to the constant voltage state, thus stably maintaining their voltage level.

Figure 5:
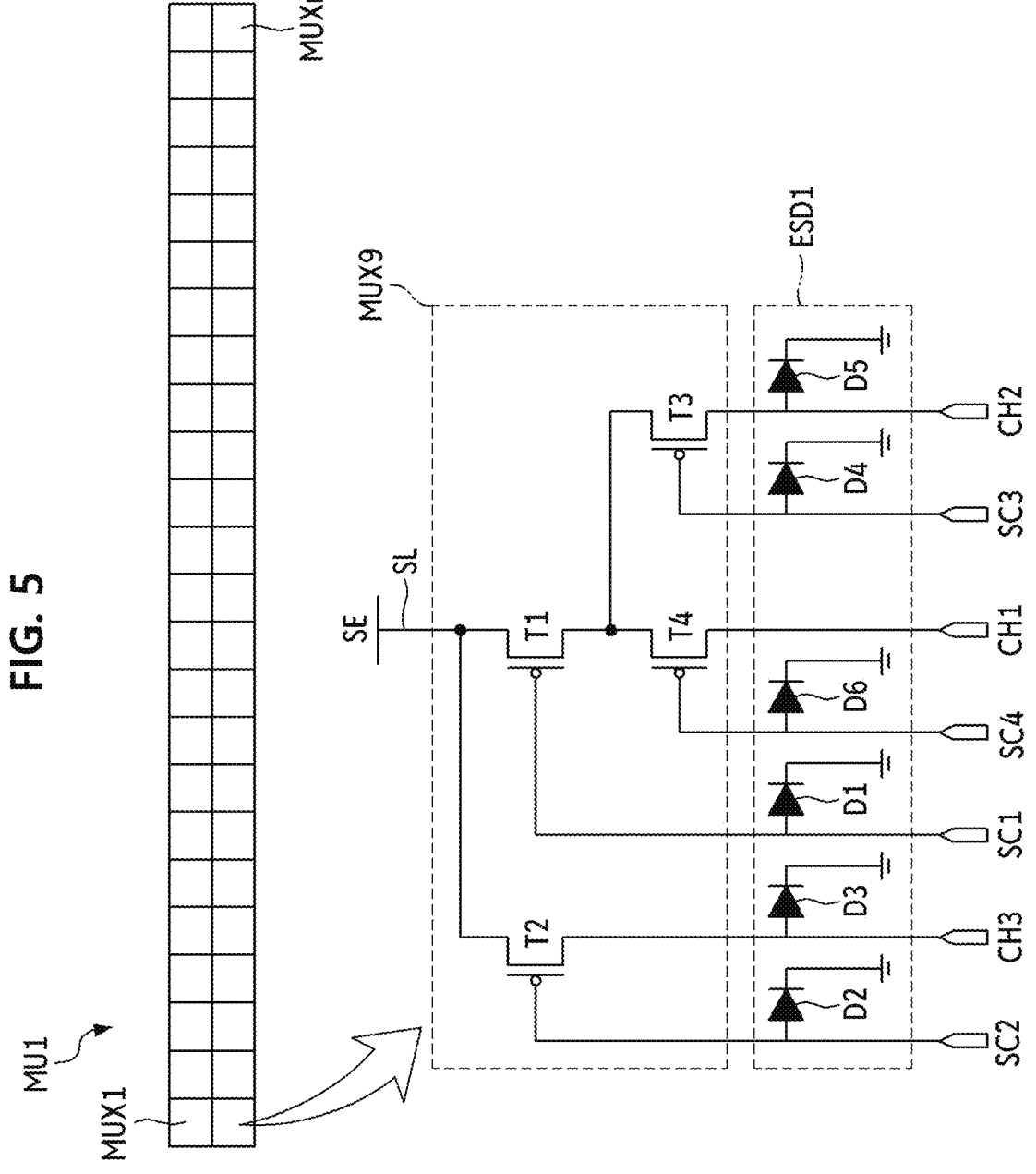
FIG. 5 is a circuit diagram illustrating a first signal selection circuit unit illustrated in FIG. 4 and a selection circuit and a first antistatic circuit unit according to a first embodiment.

FIG. 5 is a circuit diagram illustrating the first signal selection circuit unit MU1 illustrated in FIG. 4 and a selection circuit and a first antistatic circuit unit ESD1 according to a first embodiment.

Referring to FIG. 5, each of the first through $n^{th}$ signal selection circuit units MU1 through MUn may include first through $n^{th}$ signal selection circuits MUX1 through MUXn.

For example, the first signal selection circuit unit MU1 may include the first through $n^{th}$ signal selection circuits MUX1 through MUXn connected one-to-one to touch electrodes SE through touch lines SL, respectively. When the first through $n^{th}$ signal selection circuits MUX1 through MUXn are arranged in a 24×2 array, the first signal selection circuit unit MU1 may include 48 signal selection circuits MUX1 through MUXn.

Likewise, the $n^{th}$ signal selection circuit unit MUn also includes first through nth signal selection circuits MUX1 through MUXn connected one-to-one to touch electrodes SE through touch lines SL, respectively. In this way, when the first through $n^{th}$ signal selection circuits MUX1 through MUXn are arranged in a 24×2 array, each of the signal selection circuit units MU1 through MUn may include 48 signal selection circuits MUX1 through MUXn.

Each of the signal selection circuits MUX1 through MUXn may include a plurality of switching elements T1 through T4 electrically connected to each other in a combination of a serial and a parallel configurations.

For example, the first signal selection circuit MUX1 includes first and second switching elements T1 and T2 whose first electrode terminals are connected in parallel to a touch line SL, which is in turn connected to a touch electrode SE. The first signal selection circuit MUX1 also includes third and fourth switching elements T3 and T4 whose first electrode terminals are connected in parallel to a second electrode terminal of the first switching element T1.

The first electrode terminal of the first switching element T1 is connected to any one touch line SL, which is connected to a touch electrode SE, in parallel with the first electrode terminal of the second switching element T2, and the second electrode terminal of the first switching element T1 is connected to the first electrode terminals of the third and fourth switching elements T3 and T4. In addition, a gate electrode terminal of the first switching element T1 is connected to a first switching channel terminal SC1 to receive a first touch control signal input from the touch driving circuit 400.

The first electrode terminal of the second switching element T2 is connected to any one touch line SL, which is in turn connected to the touch electrode SE, in parallel with the first electrode terminal of the first switching element T1, and a second electrode terminal of the second switching element T2 is connected to a second touch driving signal input channel CH3. In addition, a gate electrode terminal of the second switching element T2 is connected to a second switching channel terminal SC2 to receive a second touch control signal input from the touch driving circuit 400.

The first electrode terminal of the third switching element T3 is connected to the second electrode terminal of the first switching element T1 in parallel with the first electrode terminal of the fourth switching element T4, and a second electrode terminal of the third switching element T3 is connected to a first touch driving signal input channel CH2. In addition, a gate electrode terminal of the third switching element T3 is connected to a third switching channel terminal SC3 to receive a third touch control signal input from the touch driving circuit 400.

The first electrode terminal of the fourth switching element T4 is connected to the second electrode terminal of the first switching element T1 in parallel with the first electrode terminal of the third switching element T3, and a second electrode terminal of the fourth switching element T4 is connected to a touch sensing signal output line and a touch sensing signal output channel CH1. In addition, a gate electrode terminal of the fourth switching element T4 is connected to a fourth switching channel terminal SC4 to receive a sensing control signal from the touch driving circuit 400.

The first switching element T1 is turned on in response to the first touch control signal input from the touch driving circuit 400 through the first switching channel terminal SC1 in the first period. When turned on, the first switching element T1 may allow a first touch driving signal, which is input to the second electrode terminal through the third switching element T3, to be transmitted to the first electrode terminal and the touch line SL.

The second switching element T2 is turned on in response to the second touch control signal input from the touch driving circuit 400 to the gate electrode terminal through the second switching channel terminal SC2 in the first period. When turned on, the second switching transistor T2 may allow a second touch driving signal, which is input to the second electrode terminal through the second touch driving signal input channel CH3, to be transmitted to the first electrode terminal and the touch line SL.

The touch driving circuit 400 may selectively generate the first or second touch control signal and transmit the first or second touch control signal to the first or second switching channel terminal SC1 or SC2 in the first period and may transmit the third touch control signal to the third switching channel terminal SC3 in the first period.

The third switching element T3 is turned on in response to the third touch control signal input from the touch driving circuit 400 to the gate electrode terminal through the third switching channel terminal SC3 in the first period. When turned on, the third switching element T3 may allow the first touch driving signal, which is input to the first touch driving signal input channel CH2, to be transmitted to the second electrode terminal of the first switching element T1.

In the second period, the touch driving circuit 400 supplies the first touch control signal to the first switching channel terminal SCI and the gate electrode terminal of the first switching element T1 and at the same time supplies the sensing control signal to the fourth switching channel terminal SC4 and the gate electrode terminal of the fourth switching element T4.

Accordingly, the first switching element T1 is turned on in response to the first touch control signal input from the touch driving circuit 400 through the first switching channel terminal SC1 in the second period. When turned on, the first switching element T1 electrically connects the touch line SL of the first electrode terminal and the first electrode terminal of the fourth switching element T4.

At the same time, the fourth switching element T4 is turned on by the sensing control signal input from the touch driving circuit 400 to the gate electrode terminal through the fourth switching channel terminal SC4 in the second period. When turned on, the fourth switching element T4 electrically connects the second electrode terminal of the first switching element T1 to the touch sensing signal output line and the touch sensing signal output channel CH1. Accordingly, in the second period, a touch sensing voltage of the touch electrode SE may be transmitted to the touch driving circuit 400 through the touch line SL, the touch sensing signal output line, and the touch sensing signal output channel CH1.

Referring to FIG. 5, each of the first through n$^{th}$ antistatic circuit units ESD1 through ESDn includes one or more antistatic circuits D1 through D6 which apply a constant voltage of a preset level to one or more of the signal input/output lines (or input/output terminals) of the first through n$^{th}$ signal selection circuit units MU1 through MUn.

For example, a first antistatic circuit D1 of the first antistatic circuit unit ESD1 is connected to the gate electrode terminal of the first switching element T1 included in each of the first through n$^{th}$ signal selection circuits MUX1 through MUXn in parallel with the first switching channel terminal SC1.

A second antistatic circuit D2 is connected to the gate electrode terminal of the second switching element T2 included in each of the first through n$^{th}$ signal selection circuits MUX1 through MUXn in parallel with the second switching channel terminal SC2.

A third antistatic circuit D3 is connected to the second electrode terminal of the second switching element T2 included in each of the first through n$^{th}$ signal selection circuits MUX1 through MUXn in parallel with the second touch driving signal input channel CH3.

A fourth antistatic circuit D4 is connected to the gate electrode terminal of the third switching clement T3 included in each of the first through n$^{th}$ signal selection circuits MUX1 through MUXn in parallel with the third switching channel terminal SC3.

A fifth antistatic circuit D5 is connected to the second electrode terminal of the third switching element T3 included in each of the first through n$^{th}$ signal selection circuits MUX1 through MUXn in parallel with the first touch driving signal input channel CH2.

A sixth antistatic circuit D6 is connected to the gate electrode terminal of the fourth switching element T4 included in each of the first through n$^{th}$ signal selection circuits MUX1 through MUXn in parallel with the fourth switching channel terminal SC4.

Figure 6:
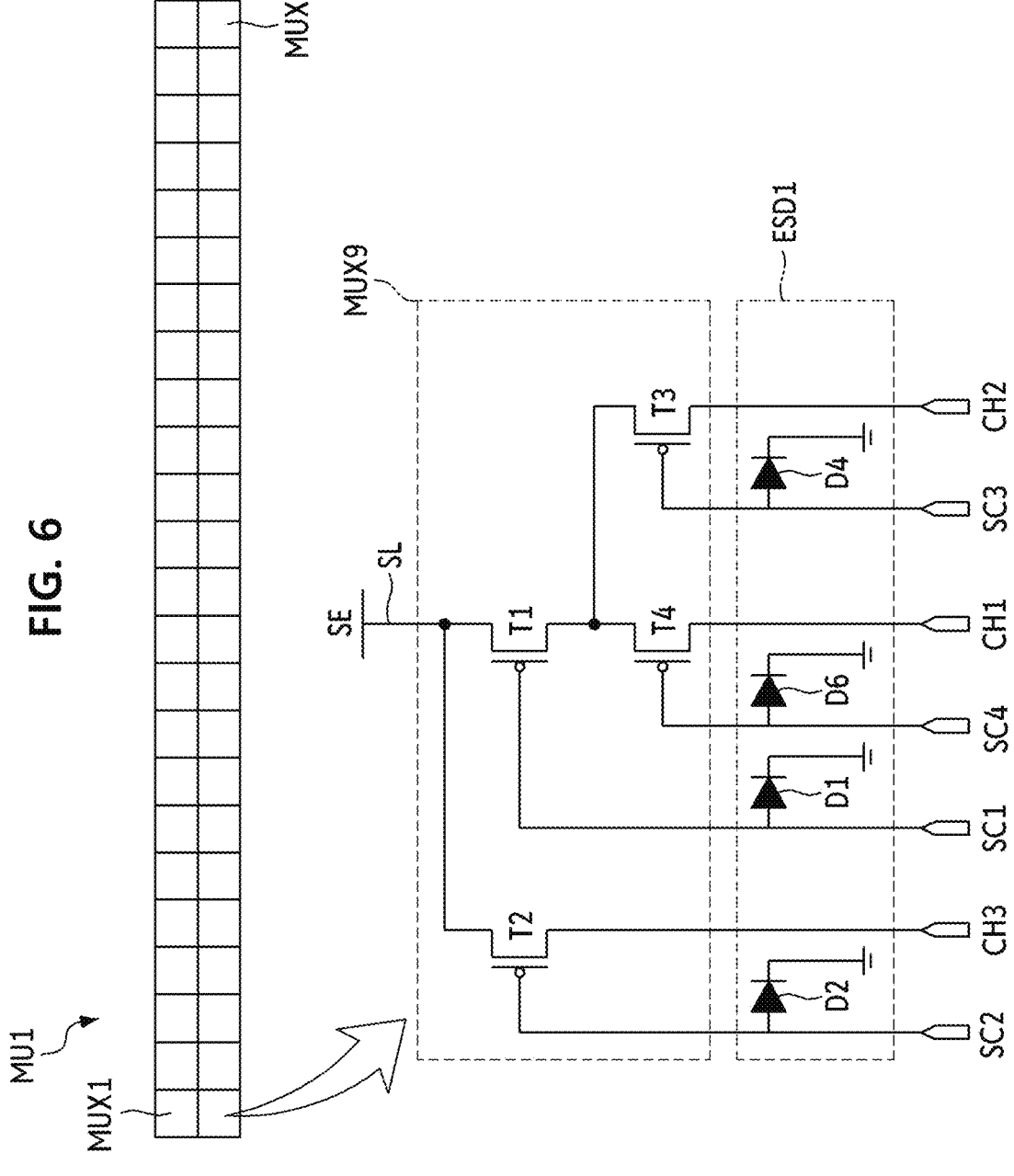
FIG. 6 is a circuit diagram illustrating the first signal selection circuit unit illustrated in FIG. 4 and a selection circuit and a first antistatic circuit unit according to a second embodiment.

FIG. 6 is a circuit diagram illustrating the first signal selection circuit unit MU1 illustrated in FIG. 4 and a selection circuit and a first antistatic circuit unit ESD1 according to a second embodiment.

Referring to FIG. 6, each of first through n$^{th}$ antistatic circuit units ESD1 through ESDn includes one or more antistatic circuits D1 through D4 which apply a constant voltage of a preset level to one or more of the signal input/output lines (or input/output terminals) of the first through n$^{th}$ signal selection circuit units MU1 through MUn.

In other words, the antistatic circuits D1 through D4 included in each of the first through n$^{th}$ circuit units ESD1 through ESDn may be respectively connected to gate electrode terminals of first through fourth switching elements T1 through T4 included in each of first through n$^{th}$ signal selection circuits MUX1 through MUXn.

For example, a first antistatic circuit D1 of the first antistatic circuit unit ESD1 is connected to the gate electrode terminal of the first switching element T1 included in each of the first through n$^{th}$ signal selection circuits MUX1 through MUXn in parallel with a first switching channel terminal SC1.

A second antistatic circuit D2 is connected to the gate electrode terminal of the second switching element T2 included in each of the first through n$^{th}$ signal selection circuits MUX1 through MUXn in parallel with a second switching channel terminal SC2.

A third antistatic circuit D3 is connected to the gate electrode terminal of the third switching element T3 included in each of the first through n$^{th}$ signal selection circuits MUX1 through MUXn in parallel with a third switching channel terminal SC3.

A fourth antistatic circuit D4 is connected to the gate electrode terminal of the fourth switching element T4 included in each of the first through n$^{th}$ signal selection circuits MUX1 through MUXn in parallel with a fourth switching channel terminal SC4.

Figure 7:
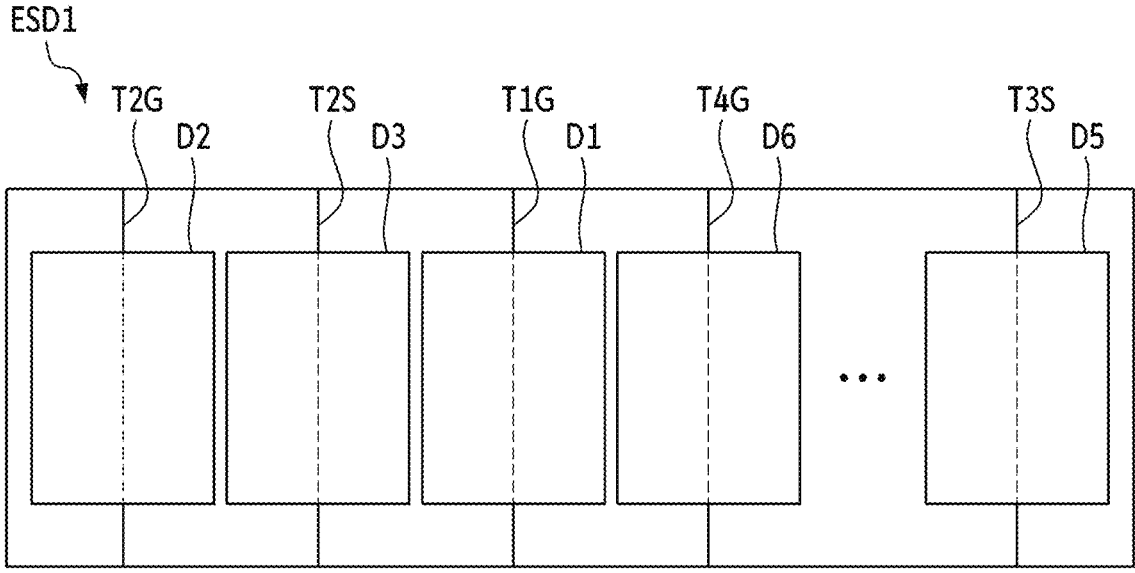
FIG. 7 is a block diagram of the first antistatic circuit unit illustrated in FIG. 5.

FIG. 7 is a block diagram of the first antistatic circuit unit ESD1 illustrated in FIG. 5.

Referring to FIGS. 5 and 7, the first antistatic circuit D1 of the first antistatic circuit unit ESD1 may be connected to the gate electrode terminal of the first switching element T1 included in each of the first through n$^{th}$ signal selection circuits MUX1 through MUXn and a connection line T1G of the first switching channel terminal SC1.

The second antistatic circuit D2 may be connected to the gate electrode terminal of the second switching element T2 included in each of the first through n$^{th}$ signal selection circuits MUX1 through MUXn and a connection line T2G of the second switching channel terminal SC2.

The third antistatic circuit D3 may be connected to the second electrode terminal of the second switching element T2 included in each of the first through n$^{th}$ signal selection circuits MUX1 through MUXn and a connection line T2S of the second touch driving signal input channel CH3.

The fourth antistatic circuit D4 may be connected to the gate electrode terminal of the third switching element T3 included in each of the first through n$^{th}$ signal selection circuits MUX1 through MUXn and a connection line of the third switching channel terminal SC3.

The fifth antistatic circuit D5 may be connected to the second electrode terminal of the third switching element T3 included in each of the first through n$^{th}$ signal selection circuits MUX1 through MUXn and a connection line T3S of the first touch driving signal input channel CH2.

The sixth antistatic circuit D6 may be connected to the gate electrode terminal of the fourth switching element T4 included in each of the first through n$^{th}$ signal selection circuits MUX1 through MUXn and a connection line T4G of the fourth switching channel terminal SC4.

Figure 8:
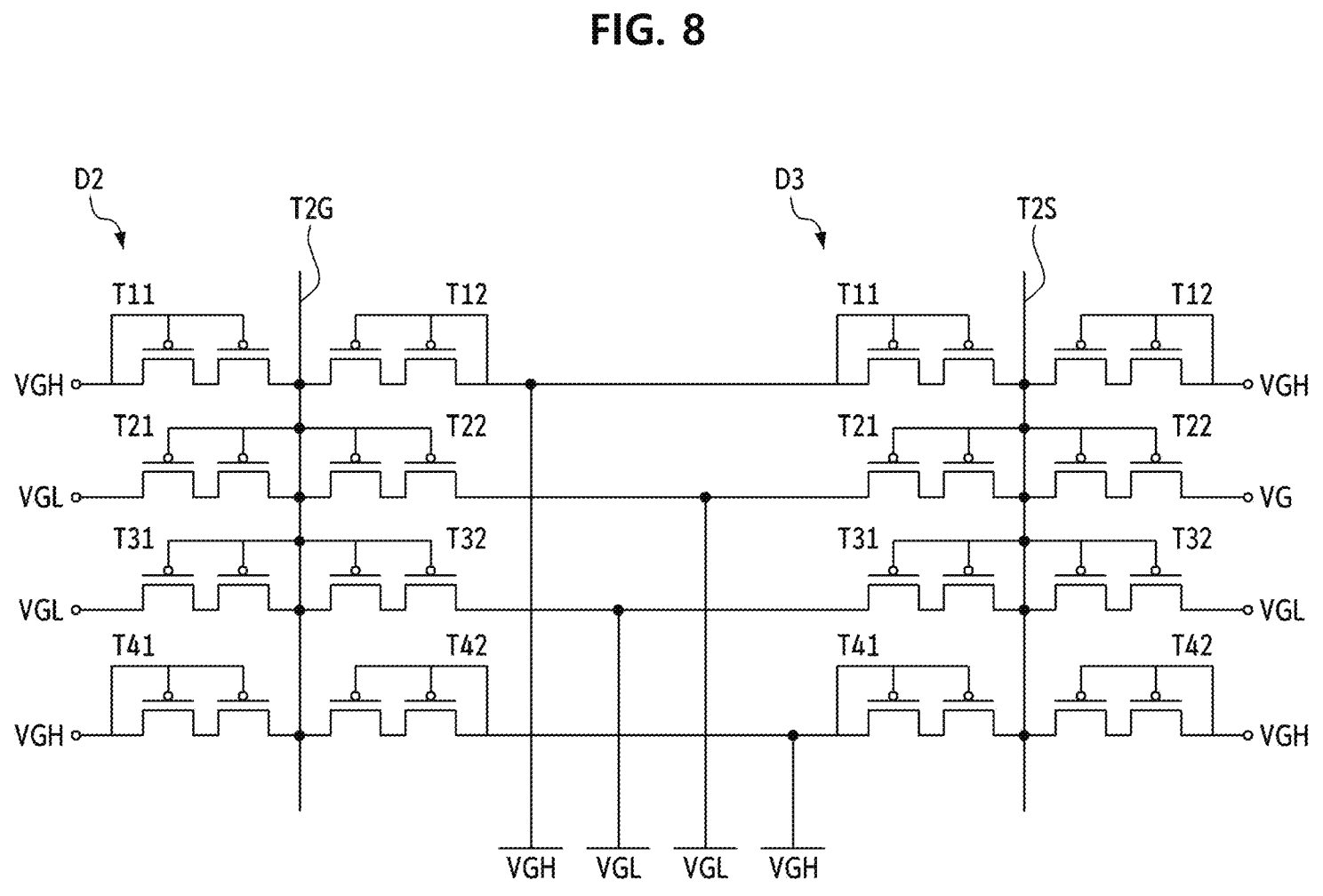

FIG. 8 is a circuit diagram of the second and third antistatic circuits D2 and D3 illustrated in FIG. 7.

Referring to FIGS. 7 and 8, one or more antistatic circuits D1 through D6 included in each of the first through n$^{th}$ antistatic circuit units ESD1 through ESDn each include a plurality of constant voltage application type thin-film transistors disposed in a parallel structure so that a high potential constant voltage of a high potential voltage source VGH is applied toward an input/output line and a plurality of constant voltage output type thin-film transistors disposed in the parallel structure so that a high potential constant voltage of the input/output line is applied toward a low potential voltage source VGL.

Specifically, referring to FIG. 8, a first thin-film transistor T11 may be connected in a diode structure such that a first electrode terminal is connected to a high potential voltage source VGH and a second electrode terminal is connected to an input/output line, so that a high potential constant voltage of the high potential voltage source VGH is applied to the input/output line.

A second thin-film transistor T12 may be connected in parallel with the first thin-film transistor T11 and may be connected in the diode structure such that a first electrode terminal is connected to the input/output line and a second electrode terminal is connected to the high potential voltage source VGH, so that the high potential constant voltage of the high potential voltage source VGH is applied toward the input/output line.

A third thin-film transistor T21 may be connected in the diode structure such that a first electrode terminal is connected to a low potential voltage source VGL and a second electrode terminal is connected to the input/output line, so that a high potential constant voltage of the input/output line is applied toward the low potential voltage source VGL.

A fourth thin-film transistor T22 may be connected in parallel with the third thin-film transistor T21 and may be connected in the diode structure such that a first electrode terminal is connected to the input/output line and a second electrode terminal is connected to the low potential voltage source VGL, so that the high potential constant voltage of the input/output line is applied toward the low potential voltage source VGL.

A fifth thin-film transistor T31 may be connected in the diode structure such that a first electrode terminal is connected to the low potential voltage source VGL and a second electrode terminal is connected to the input/output line, so that the high potential constant voltage of the input/output line is applied toward the low potential voltage source VGL.

A sixth thin-film transistor T32 may be disposed in the parallel structure to the fifth thin-film transistor T31 and may be connected in the diode structure such that a first electrode terminal is connected to the input/output line and a second electrode terminal is connected to the low potential voltage source VGL, so that the high-potential constant voltage of the input/output line is applied toward the low potential voltage source VGL.

A seventh thin-film transistor T41 may be connected in the diode structure such that a first electrode terminal is connected to the high potential voltage source VGH and a second electrode terminal is connected to the input/output line, so that the high potential constant voltage of the high potential voltage source VGH is applied toward the input/output line.

An eighth thin-film transistor T42 may be connected in parallel to the seventh thin-film transistor T41 and may be connected in the diode structure such that a first electrode terminal is connected to the input/output line and a second electrode terminal is connected to the high potential voltage source VGH, so that the high potential constant voltage of the high potential voltage source VGH is applied toward the input/output line.

In this way, the antistatic circuits D1 through D6 included in each of the first through n$^{th}$ antistatic circuit units ESD1 through ESDn can safely protect the first through nth signal selection circuits MUX1 through MUXn formed in the touch sensing unit TSU from overvoltage and overcurrent caused by static electricity, etc.

In addition, since the antistatic circuits D1 through D6 of an electrostatic circuit type are selectively formed in pad units of signal input/output terminals layer of the first through n$^{th}$ signal selection circuits MUX1 through MUXn, it is possible to minimize electrical damage applied to the signal selection circuits MUX1 through MUXn while stabilizing the level of input/output signals to the level of a constant voltage.

In concluding the detailed description, those skilled in the art will appreciate that many variations and modifications can be made to the preferred embodiments without substantially departing from the principles of the present disclosure. Therefore, the disclosed preferred embodiments of the disclosure are used in a generic and descriptive sense only and not for purposes of limitation.

What is claimed is:

1. A touch sensing module comprising:
   a touch sensing unit including touch electrodes that are arranged in a touch sensing area and touch lines connected one-to-one to the touch electrodes; and
   a touch driver detecting touch position coordinates by analyzing touch sensing signals detected from the touch electrodes,
   wherein the touch sensing unit comprises:
   first through n-th signal selection circuit units supplying touch driving signals to the touch electrodes through the touch lines, respectively, and receiving touch sensing signals from the touch electrodes wherein each of the first through n-th signal selection circuit units comprises first through n-th signal selection circuits connected one-to-one to the touch electrodes through the touch lines, each of the first through n-th signal selection circuits including a plurality of switching elements connected to input/output terminals; and
   first through n-th antistatic circuit units applying a constant voltage of a preset level to input/output terminals of the first through n-th signal selection circuits.

2. The touch sensing module of claim 1,
   wherein the first through n-th signal selection circuits receive touch driving signals of different voltage levels through a power supply unit, each of the signal selection circuits supplying any one of the touch driving signals to a touch line and a touch electrode connected to the touch line in response to a touch control signal input in a first period, and
   wherein each of the signal selection circuits electrically connects the touch line and the touch electrode to a touch sensing signal output line in response to a touch control signal input in a second period.

3. The touch sensing module of claim 2, wherein the first through n-th antistatic circuit units are connected one-to-one to the first through n-th signal selection circuit units and apply a constant voltage of a preset level to signal input/output lines of the first through n-th signal selection circuit units.

4. The touch sensing module of claim 2, wherein each of the first through n-th antistatic circuit units comprises at least one antistatic circuit that applies a constant voltage of a preset level to at least one of the signal input/output lines of the first through n-th signal selection circuit units.

5. The touch sensing module of claim 4, wherein the at least one antistatic circuit is connected to at least one of signal input/output lines of the first through n-th signal selection circuits and applies a constant voltage of a preset level to the at least one of the signal input/output lines.

6. The touch sensing module of claim 2, wherein the plurality of switching elements of the first through n-th signal selection circuits comprises:

first and second switching elements whose first electrode terminals are connected in parallel to a touch line connected to any one touch electrode; and third and fourth switching elements whose first electrode terminals are connected in parallel to a second electrode terminal of the first switching element.

7. The touch sensing module of claim 6, wherein the first electrode terminal of the first switching element is connected to any one touch line in parallel with the first electrode terminal of the second switching element, the second electrode terminal of the first switching element is connected to the first electrode terminals of the third and fourth switching elements, a gate electrode terminal of the first switching element is connected to a first switching channel terminal to receive a first touch control signal input from a display driver, the first electrode terminal of the second switching element is connected to any one touch line in parallel with the first electrode terminal of the first switching element, a second electrode terminal of the second switching element is connected to a second touch driving signal input channel, a gate electrode terminal of the second switching element is connected to a second switching channel terminal to receive a second touch control signal input from the display driver, the first electrode terminal of the third switching element is connected to the second electrode terminal of the first switching element in parallel with the first electrode terminal of the fourth switching element, a second electrode terminal of the third switching element is connected to a first touch driving signal input channel, a gate electrode terminal of the third switching element is connected to a third switching channel terminal to receive a third touch control signal input from the display driver, the first electrode terminal of the fourth switching element is connected to the second electrode terminal of the first switching element in parallel with the first electrode terminal of the third switching element, a second electrode terminal of the fourth switching element is connected to a touch sensing signal output line and a touch sensing signal output channel, and a gate electrode terminal of the fourth switching element is connected to a fourth switching channel terminal to receive a sensing control signal input from the display driver.

8. The touch sensing module of claim 7, wherein the display driver selectively generates the first or second touch control signal and transmits the first or second touch control signal to the first or second switching channel terminal in the first period, transmits the third touch control signal to the third switching channel terminal in the first period, and, in the second period, supplies the first touch control signal to the first switching channel terminal and the gate electrode terminal of the first switching element and at the same time supplies the sensing control signal to the fourth switching channel terminal and the gate electrode terminal of the fourth switching element.

9. The touch sensing module of claim 8, wherein the first switching element is turned on in response to the first touch control signal from the display driver through the first switching channel terminal in the first period and, in the turned on state, receives a first touch driving signal at the second electrode terminal from the third switching element and transmits the first touch driving signal to the touch line, the second switching element is turned on in response to the second touch control signal input from the display driver to the gate electrode terminal through the second switching channel terminal in the first period and, in the turned on state, receives a second touch driving signal at the second electrode terminal from the second touch driving signal input channel, transmits the second touch driving signal to the touch line, and the third switching element is turned on in response to the third touch control signal input from the display driver to the gate electrode terminal through the third switching channel terminal in the first period and, in the turned on state, receives the first touch driving signal at the first touch driving signal input channel, and transmits the first touch driving signal to the second electrode terminal of the first switching element.

10. The touch sensing module of claim 8, wherein the first switching element is turned on in response to the first touch control signal input from the display driver through the first switching channel terminal in the second period and electrically connects the touch line of the first electrode terminal to the first electrode terminal of the fourth switching element, and the fourth switching element is tuned on by the sensing control signal input from the display driver to the gate electrode terminal through the fourth switching channel terminal in the second period and electrically connects the second electrode terminal of the first switching element to the touch sensing signal output line and the touch sensing signal output channel.

11. The touch sensing module of claim 6, wherein each of the first through n-th antistatic circuit units comprises at least one antistatic circuit that applies a constant voltage of a preset level to at least one of the signal input/output lines of the first through n-th signal selection circuit units.

12. The touch sensing module of claim 11, wherein each of the first through n-th antistatic circuit units comprises:

a first antistatic circuit connected to the gate electrode terminal of the first switching element included in each of the first through n-th signal selection circuits and the first switching channel terminal;

a second antistatic circuit connected to the gate electrode terminal of the second switching element included in each of the first through n-th signal selection circuits and the second switching channel terminal;

a third antistatic circuit connected to the second electrode terminal of the second switching element included in each of the first through n-th signal selection circuits and the second touch driving signal input channel;

a fourth antistatic circuit connected to the gate electrode terminal of the third switching element included in each of the first through n-th signal selection circuits and the third switching channel terminal;

a fifth antistatic circuit connected to the second electrode terminal of the third switching element included in each of the first through n-th signal selection circuits and the first touch driving signal input channel; and a sixth antistatic circuit connected to the gate electrode terminal of the fourth switching element included in each of the first through n-th signal selection circuits and the fourth switching channel terminal.

13. The touch sensing module of claim 11, wherein each of the first through n-th antistatic circuit units comprises:

a first antistatic circuit connected to the gate electrode terminal of the first switching element included in each of the first through n-th signal selection circuits and the first switching channel terminal;

a second antistatic circuit connected to the gate electrode terminal of the second switching element included in each of the first through n-th signal selection circuits and the second switching channel terminal;

a third antistatic circuit connected to the gate electrode terminal of the third switching element included in each of the first through n-th signal selection circuits and the third switching channel terminal; and a fourth antistatic circuit connected to the gate electrode terminal of the fourth switching element included in each of the first through n-th signal selection circuits and the fourth switching channel terminal.

14. The touch sensing module of claim 11, wherein the at least one antistatic circuit comprises:

a first thin-film transistor connected in a diode structure such that a first electrode terminal is connected to a high potential voltage source and a second electrode terminal is connected to an input/output line, so that a high potential constant voltage of the high potential voltage source is applied to the input/output line;

a second thin-film transistor disposed in parallel with the first thin-film transistor and connected in the diode structure such that a first electrode terminal is connected to the input/output line and a second electrode terminal is connected to the high potential voltage source, so that the high potential constant voltage of the high potential voltage source is applied toward the input/output line;

a third thin-film transistor connected in the diode structure such that a first electrode terminal is connected to a low potential voltage source and a second electrode terminal is connected to the input/output line, so that a high potential constant voltage of the input/output line is applied toward the low potential voltage source;

a fourth thin-film transistor disposed in parallel with the third thin-film transistor and connected in the diode structure such that a first electrode terminal is connected to the input/output line and a second electrode terminal is connected to the low potential voltage source, so that the high potential constant voltage of the input/output line is applied toward the low potential voltage source;

a fifth thin-film transistor connected in the diode structure such that a first electrode terminal is connected to the low potential voltage source and a second electrode terminal is connected to the input/output line, so that the high potential constant voltage of the input/output line is applied toward the low potential voltage source;

a sixth thin-film transistor disposed in parallel to the fifth thin-film transistor and connected in the diode structure such that a first electrode terminal is connected to the input/output line and a second electrode terminal is connected to the low potential voltage source, so that the high potential constant voltage of the input/output line is applied toward the low potential voltage source;

a seventh thin-film transistor connected in the diode structure such that a first electrode terminal is connected to the high potential voltage source and a second electrode terminal is connected to the input/output line, so that the high potential constant voltage of the high potential voltage source is applied toward the input/output line; and an eighth thin-film transistor disposed in parallel to the seventh thin-film transistor and connected in the diode structure such that a first electrode terminal is connected to the layer input/output line and a second electrode terminal is connected to the high potential voltage source, so that the high potential constant voltage of the high potential voltage source is applied toward the input/output line.

15. A display device comprising:

a display panel comprising a display area where a plurality of pixels are arranged; and a touch sensing module extending to the front of the display panel and detecting a touch of a user, wherein the touch sensing module comprises:

a touch sensing unit including touch electrodes that are arranged in a touch sensing area and touch lines connected one-to-one to the touch electrodes; and a touch driver detecting touch position coordinates by analyzing touch sensing signals detected from the touch electrodes, wherein the touch sensing unit comprises:

first through n-th signal selection circuit units supplying touch driving signals to the touch electrodes through the touch lines, respectively, and receiving touch sensing signals from the touch electrodes wherein each of the first through n-th signal selection circuit units comprises first through n-th signal selection circuits connected one-to-one to the touch electrodes through the touch lines, each of the first through n-th signal selection circuits including a plurality of switching elements connected to input/output terminals; and first through n-th antistatic circuit units applying a constant voltage of a preset level to input/output terminals of the first through n-th signal selection circuits.

16. The display device of claim 15, wherein the first through n-th signal selection circuits receive touch driving signals of different voltage levels through a power supply unit, each of the signal selection circuits supplying any one of the touch driving signals to a touch line and a touch electrode connected to the touch line in response to a touch control signal input in a first period, and wherein each of the signal selection circuits electrically connects the touch line and the touch electrode to a touch sensing signal output line in response to a touch control signal input in a second period.

17. The display device of claim 16, wherein the plurality of switching elements comprises:

first and second switching elements whose first electrode terminals are connected in parallel to a touch line connected to any one touch electrode; and third and fourth switching elements whose first electrode terminals are connected in parallel to a second electrode terminal of the first switching element.

18. The display device of claim 16, wherein each of the first through n-th antistatic circuit units comprises at least one antistatic circuit which applies a constant voltage of a preset level to at least one of signal input/output lines of the first through n-th signal selection circuit units.

19. The display device of claim 18, wherein each of the first through n-th antistatic circuit units comprises:

a first antistatic circuit connected to a gate electrode terminal of the first switching element included in each of the first through n-th signal selection circuits and a first switching channel terminal;

a second antistatic circuit connected to a gate electrode terminal of the second switching element included in each of the first through n-th signal selection circuits and a second switching channel terminal;

a third antistatic circuit connected to a gate electrode terminal of the third switching element included in each of the first through n-th signal selection circuits and a third switching channel terminal; and a fourth antistatic circuit connected to a gate electrode terminal of the fourth switching element included in each of the first through n-th signal selection circuits and a fourth switching channel terminal.

20. An electronic device including a display device, wherein the display device comprises:

a display panel comprising a display area where a plurality of pixels are arranged; and a touch sensing module extending to the front of the display panel and detecting a touch of a user, wherein the touch sensing module comprises:

a touch sensing unit including touch electrodes that are arranged in a touch sensing area and touch lines connected one-to-one to the touch electrodes; and a touch driver detecting touch position coordinates by analyzing touch sensing signals detected from the touch electrodes, wherein the touch sensing unit comprises:

first through n-th signal selection circuit units supplying touch driving signals to the touch electrodes through the touch lines, respectively, and receiving touch sensing signals from the touch electrodes wherein each of the first through n-th signal selection circuit units comprises first through n-th signal selection circuits connected one-to-one to the touch electrodes through the touch lines, each of the first through n-th signal selection circuits including a plurality of switching elements connected to input/output terminals; and first through n-th antistatic circuit units applying a constant voltage of a preset level to input/output terminals of the first through n-th signal selection circuits.

\* \* \* \* \*